United States Patent
Jadhav et al.

(10) Patent No.: US 7,875,972 B2
(45) Date of Patent: Jan. 25, 2011

(54) SEMICONDUCTOR DEVICE ASSEMBLY HAVING A STRESS-RELIEVING BUFFER LAYER

(75) Inventors: Virendra R. Jadhav, Wappingers Falls, NY (US); Kamal K. Sikka, Poughkeepsie, NY (US); Jiantao Zheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/491,517

(22) Filed: Jun. 25, 2009

(65) Prior Publication Data

US 2010/0327430 A1    Dec. 30, 2010

(51) Int. Cl.
*H01L 23/34*    (2006.01)

(52) U.S. Cl. .................. 257/712; 257/E23.08
(58) Field of Classification Search .................. 257/712, 257/713, E23.08
See application file for complete search history.

(56) References Cited

U.S. PATENT DOCUMENTS

| 4,278,990 | A | | 7/1981 | Fichot |
| 5,658,831 | A | * | 8/1997 | Layton et al. .................. 29/832 |
| 6,285,078 | B1 | * | 9/2001 | Nelson ........................ 257/712 |
| 6,535,533 | B2 | | 3/2003 | Lorenzen et al. |
| 7,288,438 | B2 | | 10/2007 | Lu |
| 7,294,933 | B2 | | 11/2007 | Hanaoka |
| 7,319,591 | B2 | | 1/2008 | Coffin et al. |

OTHER PUBLICATIONS

Addamiano, Chemical Vapor Deposition (CVD) of Cubic Silicon Carbide SIC, United States Statutory Invention Registration H28, Published Feb. 4, 1986.

* cited by examiner

*Primary Examiner*—Roy K Potter
(74) *Attorney, Agent, or Firm*—Wenjie Li; Ira D. Blecker

(57) ABSTRACT

Disclosed is a multilayer thermal interface material which includes a first layer of metallic thermal interface material, a buffer layer and preferably a second layer of thermal interface material which may be metallic or nonmetallic. The multilayer thermal interface material is used in conjunction with a semiconductor device assembly of a chip carrier substrate, a heat spreader for attaching to the substrate, a semiconductor device mounted on the substrate and underneath the heat spreader and the multilayer thermal interface material interposed between the heat spreader and the semiconductor device. The heat spreader has a first coefficient of thermal expansion (CTE), CTE1, the buffer layer has a second CTE, CTE2, and the semiconductor device has a third CTE, CTE3, wherein CTE1>CTE2>CTE3.

17 Claims, 4 Drawing Sheets

SEMICONDUCTOR DEVICE ASSEMBLY HAVING A STRESS-RELIEVING BUFFER LAYER

BACKGROUND OF THE INVENTION

The present invention relates to a thermal interface material and package thermal design for a semiconductor device which includes a stress-relieving buffer layer.

A flip chip package, more specifically an organic flip chip package, including a flip chip on a multi-layer carrier, inherently warps within a predetermined temperature range because of the coefficient of thermal expansion (CTE) mismatch between the flip chip and the multi-layer carrier. For example, a chip may have a CTE of 3 ppm/° C. while an organic chip carrier may have a CTE of 17-24 ppm/° C. Such a CTE mismatch can lead to bending of the carrier. If a heat spreader or lid is attached to the back surface of a chip with a thermal interface material, such as a thermally conductive grease, an uneven grease-filled gap can result between the chip and the heat spreader or lid. The thermal interface material can also be stretched as a result of the bending of the carrier which can impact thermal performance adversely. In a severe situation, cracking or debonding of the thermal interface material can occur.

BRIEF SUMMARY OF THE INVENTION

The various advantages and purposes of the present invention as described above and hereafter are achieved by providing, according to a first aspect of the invention, a heat spreader assembly comprising:

a heat spreader for a chip carrier substrate, the heat spreader having a first coefficient of thermal expansion, CTE1;

a multilayer thermal interface material in contact with the heat spreader, the thermal interface material comprising a first layer of metallic thermal interface material in contact with the heat spreader and a buffer layer in contact with the first layer of metallic thermal interface material, the buffer layer having a second coefficient of thermal expansion CTE2 wherein CTE1>CTE2.

According to a second aspect of the invention, there is provided a semiconductor device assembly comprising:

a chip carrier substrate;

a heat spreader for attaching to the substrate, the heat spreader having a first coefficient of thermal expansion, CTE1;

a semiconductor device mounted on the substrate and underneath the heat spreader, the semiconductor device having a third coefficient of thermal expansion, CTE3;

a multilayer thermal interface material interposed between the heat spreader and the semiconductor device, the thermal interface material comprising a first layer of metallic thermal interface material in contact with the heat spreader and a buffer layer in contact with the first layer of metallic thermal interface material, the buffer layer having a second coefficient of thermal expansion, CTE2 wherein CTE1>CTE2>CTE3.

According to a third aspect of the present invention, there is provided a semiconductor device assembly comprising:

a chip carrier substrate;

a semiconductor device mounted on the substrate, the semiconductor device having a first coefficient of thermal expansion, CTE1;

a multilayer thermal interface material on the semiconductor device, the thermal interface material comprising a first layer of metallic thermal interface material and a buffer layer in contact with the first layer of metallic thermal interface material, the buffer layer having a second coefficient of thermal expansion, CTE2 wherein CTE1>CTE2 and a layer of thermal interface material in contact with the buffer layer and the semiconductor device.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
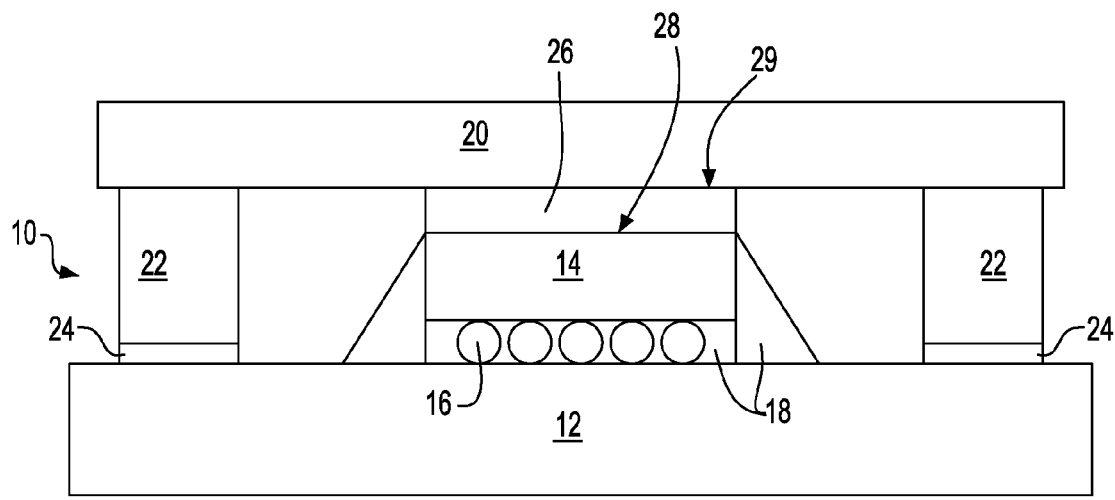
FIG. 1 is a side view of a prior art semiconductor device assembly.

Referring to the Figures in more detail, and particularly referring to FIG. 1, there is shown a side view of a prior art semiconductor device assembly 10. The semiconductor device assembly 10 includes a chip carrier substrate 12, such as an organic chip carrier, upon which a chip 14, hereafter referred to as a semiconductor device, is mounted in the so-called flip chip position. By flip chip, it is meant that the semiconductor device 14 is mounted active side down and the semiconductor device 14 makes connections to the substrate 12 through solder balls 16 or other well-known electrical connections. There may also be a conventional underfill material 18. The semiconductor device assembly 10 may also include a lid or heat spreader 20 (hereafter collectively referred to as just "heat spreader") which removes heat generated by the semiconductor device 14. The heat spreader 20 may be supported by legs 22 which are firmly attached to the substrate 12 by adhesive 24. Lastly, in order to have good thermal contact between the semiconductor device 14 and the heat spreader 20, there is also a conventional thermal interface material 26. The conventional thermal interface material 26 may comprise a nonmetallic thermal grease, paste or gel.

In practice, the coefficient of thermal expansion (CTE) mismatch between the semiconductor device 14 and the substrate 12 can lead to bending of the substrate 12 and the device 14 and thus stretching of the thermal interface material 26 which can lead to cracking or debonding of the thermal interface material 26 from the semiconductor device 14. This cracking or debonding of the thermal interface material 26 can occur at the interface 28 (shown in FIG. 1) between the thermal interface material 26 and the semiconductor device 14 or at the interface 29 between the thermal interface material 26 and the heat spreader 20.

Figure 2:
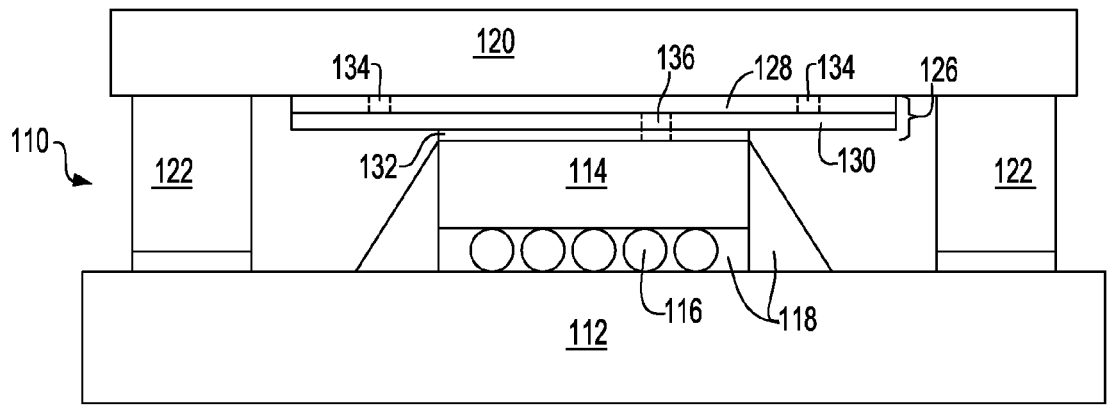
FIG. 2 is a side view of a semiconductor device assembly according to the present invention.

Referring now to FIG. 2, there is shown a side view of a semiconductor assembly according to the present invention. There is shown a semiconductor device assembly 110 comprising a semiconductor device 114 mounted on a chip carrier substrate 112. The semiconductor device 114 makes electrical connection with the substrate 112 through solder balls 116 or other electrical connection devices known to those skilled in the art. The semiconductor device 114 may have an underfill material 118 around and underneath the semiconductor device 114. The semiconductor device assembly 110 further comprises a heat spreader 120 which may have legs 122 which are fixed to the substrate 112 by adhesive 124. In order to remove heat from the semiconductor device 114, the present invention further comprises a multilayer thermal interface material, generally indicated by 126.

The multilayer thermal interface material 126 includes a first layer 128 of metallic thermal interface material in contact with the heat spreader 120. Suitable materials for the first layer 128 of metallic thermal interface material include indium (by itself as elemental indium) and low melt solder alloys such as 97% indium/3% silver and 58% bismuth/42% tin (by weight percent). The material should be such that it is capable of reflowing at a low temperature to fuse to the heat spreader 120 if desired.

The multilayer thermal interface material 126 further includes a buffer layer 130 in contact with the first layer 128 of metallic thermal interface material. The purpose of the buffer layer 130 is as follows. The heat spreader 120 has a CTE of about 17 ppm/° C. (similar to that of the chip carrier substrate 112) while the semiconductor device 114 has a CTE of about 3 ppm/° C. This large mismatch in CTE between the heat spreader 120 and semiconductor device 114 can lead to stresses in the thermal interface material 126. To relieve those stresses, buffer layer 130 having an intermediate CTE value is inserted between the first layer 128 of metallic thermal interface material and the semiconductor device 114. In other words, where the CTE of heat spreader 120 is CTE1, the CTE of buffer layer 130 is CTE2 and the CTE of semiconductor device 114 is CTE3, then CTE1>CTE2>CTE3. More precisely, buffer layer 130 should be chosen from a material having the following properties:

a CTE between that of the semiconductor device and the heat spreader, and preferably closer to the semiconductor device than the heat spreader;

thermal conductivity between that of the heat spreader 120 and first layer 128 of the thermal interface material 126;

readily manufacturable into a thin, flat plate;

should be available in thin sheets in the range of hundreds of microns; and competitive in cost with a thermal interface material consisting entirely of first layer 128.

Some materials meeting these requirements include alloys of aluminum/silicon/carbon (AlSiC), tungsten and copper (W/Cu), and molybdenum and copper (MoCu) and laminates of copper, molybdenum and copper (Cu/Mo/Cu).

As can be seen from FIGS. 2 and 3, the first layer 128 of metallic thermal interface material and buffer layer 130 extend beyond the dimensions of the semiconductor device 114.

FIGS. 2 and 3 also illustrate two other preferred features of the present invention. One of these preferred features is standoffs 134 in the first layer 128 of metallic thermal interface material. The standoffs 134 ensure consistent thermal interface material thickness between the heat spreader 120 and buffer layer 130. Moreover, the standoffs 134 can act as crack stops. As best shown in FIG. 3, the standoffs 134 can be only segments (FIG. 3B) or may circle the entire chip circumference (FIG. 3D).

Figure 3A:
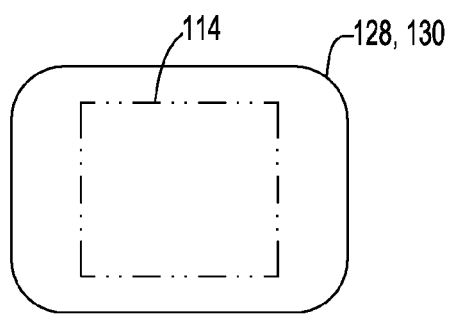
FIGS. 3A, 3B, 3C and 3D include top views of various embodiments of the multilayer thermal interface material according to the present invention.
Figure 3B:
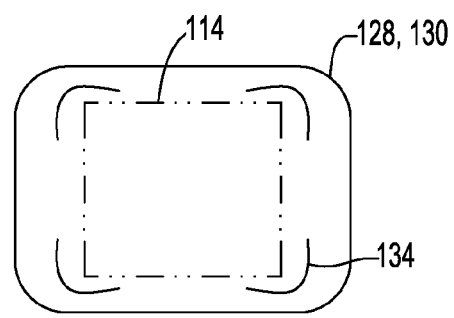
Figure 3C:
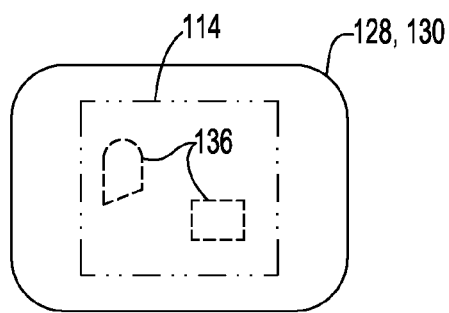
Figure 3D:
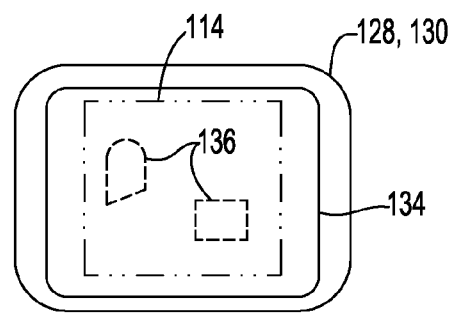

Another of the preferred features is for the buffer layer 120 to have perforations 136, as best shown in FIGS. 3C and 3D. The perforations eliminate any additional thermal resistance due to the presence of the buffer layer 120, especially over hot spot regions. The perforations 136 may be used without standoffs as shown in FIG. 3C or with standoffs 134 as shown in FIG. 3D. The perforations 136 may take on any shape that allows for the reduction of thermal resistance. The flexibility provided by this invention to use rounded corners for the first metallic layer 128 of the thermal interface material 126 also helps reduce the high stress concentrations caused by sharp corners in conventional designs.

In one preferred embodiment, there is an additional layer 132 of thermal interface material in contact with the buffer layer 130. Referring again to FIG. 2, the additional layer 132 of thermal interface material is placed between the buffer layer 130 and the semiconductor device 114. In one preferred embodiment, the additional layer 132 of thermal interface material may be made of a metallic material similar to first layer 128 of metallic thermal interface material. Again, suitable materials include indium (by itself as elemental indium) and low melt solder alloys such as 97% indium/3% silver and 58% bismuth/42% tin (by weight percent). While the additional layer 132 of thermal interface material and the first layer 128 of metallic thermal interface material may be made of the same material, this is not required and they may be made of different metallic materials so long as they are both made from the suitable materials mentioned above.

In one preferred embodiment, the additional layer 132 of thermal interface material may alternatively be made of a nonmetallic material such as a thermal gel, paste or grease. These are conventional materials which are classified as nonmetallic materials although they may contain metallic or nonmetallic high conductivity particles for thermal conductivity.

Figure 5:
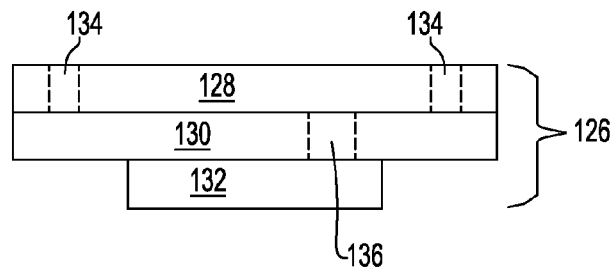
FIG. 5 is an enlarged side view of the multilayer thermal interface material according to the present invention.

FIG. 5 is an enlarged side view of the multilayer thermal interface material 126 showing the first layer 128 of metallic thermal interface material, buffer layer 130, additional layer 132 of thermal interface material, optional standoffs 134 and optional perforation 136.

Figure 4A:
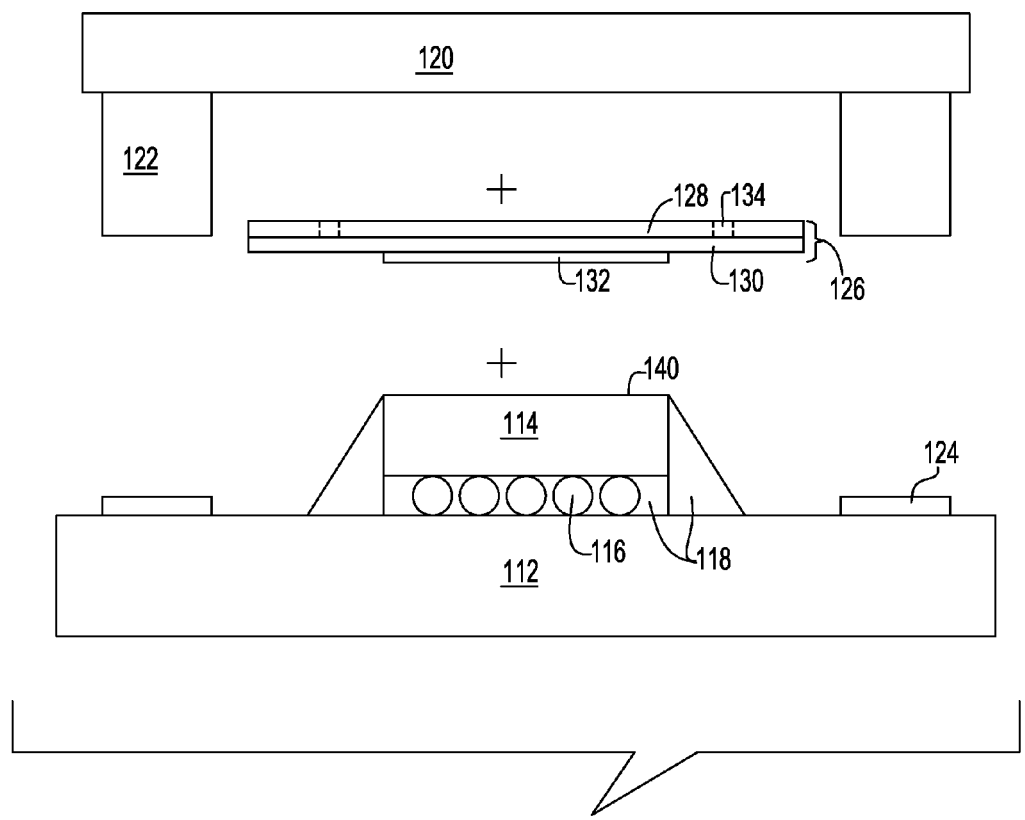
FIGS. 4A and 4B are exploded views of two different ways of assembling a semiconductor device assembly according to the present invention.
Figure 4B:
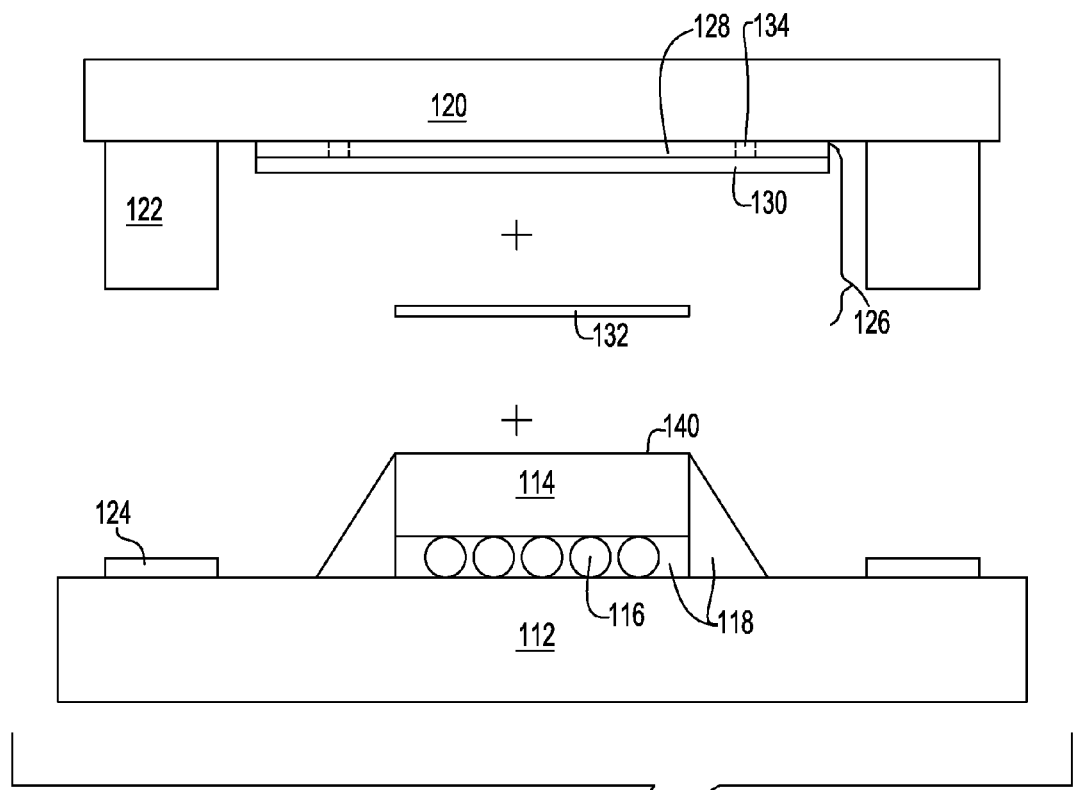

FIGS. 4A and 4B illustrate two methodologies for assembling the semiconductor device assembly 110 according to the present invention. Turning first to FIG. 4A, the multilayer thermal interface material 126 comprising first layer 128 of metallic thermal interface material, buffer layer 130 and a second layer 132 of metallic thermal interface material is assembled and then placed on the semiconductor device 114. It may be desirable to metalize the surface 140 of semiconductor device 114 with, for example, nickel or gold, prior to placing the multilayer thermal interface material 126 on the semiconductor device 114. Thereafter, heat spreader 120 is placed on the multilayer thermal interface material 126 and then the entire assembly is heated to a predetermined temperature to reflow the first layer 128 of metallic thermal interface material and the second metallic layer of thermal interface material 132.

FIG. 4B illustrates the second methodology for forming the semiconductor device assembly 110 according to the present invention. The first layer 128 of metallic thermal interface material and buffer layer 130 are placed against the heat spreader 120. The first layer 128 of metallic thermal interface material should be in direct contact with the heat spreader 120. This subassembly is heated to a predetermined temperature to reflow the first layer 128 of metallic thermal interface material. Thereafter, a second layer 132 of thermal interface material is placed on semiconductor device 114 followed by the first layer 128 of metallic thermal interface material, buffer layer 130 and heat spreader 120. Second layer 132 of thermal interface material may be metallic (for example, indium or low melt solder alloy) or nonmetallic (thermal gel, paste or grease). If the second layer 132 of thermal interface material is metallic, then surface 140 of semiconductor device 114 may need to be metalized.

The advantages of the present invention include reducing stress raisers at semiconductor device corners, thus reducing cracking tendency of the thermal interface material 126 (either cohesively or adhesively at either of the interface with the heat spreader 120 or the semiconductor device 114) and eliminating stress raisers between the buffer layer 130 and the heat spreader 120, thus reducing cracking tendency.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A heat spreader assembly comprising:
a heat spreader for a chip carrier substrate, the heat spreader having a first coefficient of thermal expansion, CTE1;
a multilayer thermal interface material in contact with the heat spreader, the thermal interface material comprising a first layer of metallic thermal interface material in contact with the heat spreader and a buffer layer in contact with the first layer of metallic thermal interface material, the buffer layer having a second coefficient of thermal expansion CTE2 wherein CTE1>CTE2 and wherein the buffer layer is selected from the group consisting of tungsten/copper, molybdenum/copper, copper/molybdenum/copper and aluminum/silicon carbide.

2. A heat spreader assembly comprising:
a heat spreader for a chip carrier substrate, the heat spreader having a first coefficient of thermal expansion, CTE1;
a multilayer thermal interface material in contact with the heat spreader, the thermal interface material comprising a first layer of metallic thermal interface material in contact with the heat spreader and a buffer layer in contact with the first layer of metallic thermal interface material, the buffer layer having a second coefficient of thermal expansion CTE2 wherein CTE1>CTE2 and wherein the thermal interface material further comprises a second layer of metallic thermal interface material in contact with the buffer layer.

3. The heat spreader assembly of claim 2 wherein the first and second layers of metallic thermal interface material are selected from the group consisting of indium (by itself as elemental indium) and low melt solder alloys.

4. The heat spreader assembly of claim 1 wherein the thermal interface material further comprises a layer of nonmetallic thermal interface material in contact with the buffer layer.

5. The heat spreader assembly of claim 4 wherein the nonmetallic thermal interface material is selected from the group of materials consisting of nonmetallic thermal gels, pastes and greases.

6. The heat spreader assembly of claim 1 wherein the buffer layer is perforated.

7. The heat spreader assembly of claim 1 wherein the first layer of metallic thermal interface material comprises a standoff.

8. A semiconductor device assembly comprising:
a chip carrier substrate;
a heat spreader for attaching to the substrate, the heat spreader having a first coefficient of thermal expansion, CTE1;
a semiconductor device mounted on the substrate and underneath the heat spreader, the semiconductor device having a third coefficient of thermal expansion, CTE3;
a multilayer thermal interface material interposed between the heat spreader and the semiconductor device, the thermal interface material comprising a first layer of metallic thermal interface material in contact with the heat spreader and a buffer layer in contact with the first layer of metallic thermal interface material, the buffer layer having a second coefficient of thermal expansion, CTE2 wherein CTE1>CTE2>CTE3 and wherein the buffer layer is selected from the group consisting of tungsten/copper, molybdenum/copper, copper/molybdenum/copper and aluminum/silicon carbide.

9. A semiconductor device assembly comprising:
a chip carrier substrate;
a heat spreader for attaching to the substrate, the heat spreader having a first coefficient of thermal expansion, CTE1;
a semiconductor device mounted on the substrate and underneath the heat spreader, the semiconductor device having a third coefficient of thermal expansion, CTE3;
a multilayer thermal interface material interposed between the heat spreader and the semiconductor device, the thermal interface material comprising a first layer of metallic thermal interface material in contact with the heat spreader and a buffer layer in contact with the first layer of metallic thermal interface material, the buffer layer having a second coefficient of thermal expansion, CTE2 wherein CTE1>CTE2>CTE3 and wherein the thermal interface material further comprises a second layer of metallic thermal interface material in contact with the buffer layer and the semiconductor device.

10. The semiconductor device assembly of claim 9 wherein the first and second layers of metallic thermal interface material are selected from the group consisting of indium (by itself as elemental indium) and low melt solder alloys.

11. The semiconductor device assembly of claim 8 wherein the thermal interface material further comprises a layer of nonmetallic thermal interface material in contact with the buffer layer and the semiconductor device.

12. The semiconductor device assembly of claim 11 wherein the nonmetallic thermal interface material is selected from the group of materials consisting of nonmetallic thermal gels, pastes and greases.

13. The semiconductor device assembly of claim 8 wherein the buffer layer is perforated.

14. The semiconductor device assembly of claim 8 wherein the buffer layer has high conductivity, is manufacturable, is available in thin sheets and is of low cost.

15. The semiconductor device assembly of claim 8 wherein the first layer of metallic thermal interface material comprises a standoff.

16. A semiconductor device assembly comprising:
a chip carrier substrate;

a semiconductor device mounted on the substrate, the semiconductor device having a first coefficient of thermal expansion, CTE1;

a multilayer thermal interface material on the semiconductor device, the thermal interface material comprising a first layer of metallic thermal interface material and a buffer layer in contact with the first layer of metallic thermal interface material, the buffer layer having a second coefficient of thermal expansion, CTE2 wherein CTE1>CTE2 and a layer of thermal interface material in contact with the buffer layer and the semiconductor device wherein the buffer layer is selected from the group consisting of tungsten/copper, molybdenum/copper, copper/molybdenum/copper and aluminum/silicon carbide.

17. The semiconductor device assembly of claim 16 wherein the buffer layer is perforated.

* * * * *